United States Patent [19]

Caroli

[11] 4,348,773
[45] Sep. 7, 1982

[54] MICROWAVE RECEIVER CONVERTERS HAVING A HYBRID WAVEGUIDE STRUCTURE

[76] Inventor: Ignazio Caroli, Via Luigi Capuana, 135, 00137 Roma, Italy

[21] Appl. No.: 112,285

[22] Filed: Jan. 15, 1980

[51] Int. Cl.³ .......................... H04B 1/26; H03D 7/14
[52] U.S. Cl. ................................... 455/326; 455/330; 333/238
[58] Field of Search ............... 455/326, 325, 323, 328, 455/330; 321/69 R, 69 W, 69 NL; 307/257, 259; 332/47; 363/159; 333/238, 246, 247

[56] References Cited

U.S. PATENT DOCUMENTS

| | | | |
|---|---|---|---|
| 2,475,064 | 7/1949 | Van Weel | 455/328 |
| 2,576,481 | 11/1951 | Rodwin | 455/328 |
| 4,032,850 | 6/1977 | Hill | 455/326 |
| 4,099,126 | 7/1978 | Haliford | 455/326 |
| 4,112,374 | 9/1978 | Steinbrecher | 455/326 |

Primary Examiner—Tommy P. Chin
Attorney, Agent, or Firm—Balogh, Osann, Kramer, Dvorak, Genova & Traub

[57] ABSTRACT

A microwave receiver converter apparatus of a balanced mixer type utilizes a hybrid waveguide having a parallelopiped construction having one side, which is open, adapted to receive a radio frequency (RF) input and provided with a susceptance device, a second side, orthogonal to the first side, adapted to provide an intermediate frequency (IF) output, and a third side, opposite to the second side, having an opening in which is disposed a cylindrical element and adapted to be coupled to a local oscillator (LO). A pair of diodes is coaxially mounted in the waveguide in a spaced apart relationship by means of connecting elements supported on an insulation block through which passes the IF output which is coupled to first ends of the diodes through a pair of helical inductance elements L. The other ends of the diodes are connected to ground via a reactance X. The susceptance device is placed in the RF line at a distance $l_1$ from the diodes and comprises a pair of cylindrical elements, threadedly engaged with the waveguide to permit spatial adjustment between the oppositely located free ends of the elements. The free ends are provided with off-center projections so that, upon the rotation of the elements, the distance between the projections and the diodes can be adjusted. This adjustability permits different types of diodes to be used in the apparatus.

6 Claims, 9 Drawing Figures

FOUR PORT HYBRID WAVEGUIDE STRUCTURE

FOUR PORT HYBRID WAVEGUIDE STRUCTURE

FIG. 6

EQUIVALENT CIRCUIT
FOR R.F. MATCHING OSCILLATOR

EQUIVALENT CIRCUIT
FOR IMAGE OSCILLATOR

LOADED FORM WAVE GUIDE

MICROWAVE RECEIVER CONVERTERS HAVING A HYBRID WAVEGUIDE STRUCTURE

BACKGROUND OF THE INVENTION

1. Field of Invention

The present invention relates generally to circuits for controlling diode switches by a ratio frequency input and, more specifically, to a circuit utilized as a microwave receiver converter having a hybrid structure.

2. Description of Prior Art

It is known that one of the most important problems to be faced in the design of receiver converters in that of minimizing as far as possible the noise of these devices.

However, it is evident that the solution of the problem lies in achieving such objectives as the obtaining of special electrical characteristics (e.g., the bandwidth and range of operation, linearity for high input signals, impedance presented at the working frequency, etc.) or structural and technological characteristics (MIC type structures or classical type structures designed with more or less sophisticated functions or operation, diodes in CHIP form or diodes incapsulated in robust and manageable packages) or functional characteristics (e.g., degree of deterioration of the characteristics due to failure of a diode in the case of a balanced converter; or due to variation of the power of the local oscillation (L.O.): capacity of overcoming special mechanical or electrical requirements, etc.).

In the literature (Torrey and Whitmar—"Crystal Rectifiers" MIT vol. 15; Mohr and Kwitt—"A Note on the Optimum Source Conductance of Crystal Mixers'-'—IRE MTT 8 pp 622; Barber—"Noise Figure and Conversion Loss of the Schottky Barrier Mixer Diode'-'—IEEE MTT 15 p. 629–635; Stracca—"Noise in Frequency Mixers Using Non-linear Resistors"—A. F. 1971 pp 484–505; Caroli—"Considerazioni sui Convertitori di Oscillazioni a Microonda"—Genoa Congress 1968; Kelly—"Fundamental Limits on Conversion Loss of Double Sideband Mixers". TRANS. IEEE MTT November 1977) typical and experimental analyses are well known which give the general criteria to be followed to operate in this way and which identify the main problem to be solved as being an efficient control of the current due to the image frequency and to various idle frequencies, and therefore the need to maintain high values for the signal-to-noise ratio.

That means that maximum care must be paid to ensuring that the non linear devices used in the converter are correctly terminated at the image and idle frequencies.

The more accurately these terminations are controlled by the network used to actuate the converter, the more easily characteristics favorable in the way described above and their repetivity can be achieved.

The problem of controlling idle frequencies has resulted in a preference for balanced configuration converters (originally used for their capability of cancelling the out-of-band noise of klystrons), since as is known from the literature, they allow the separation of some of the idle frequencies between the local oscillation (LO) and radio frequency (RF) ports and therefore simplify the problem of controlling them.

The problem of the control of the image frequency on the other hand is very complex and has been tackled in the present-day technique by the insertion of a suitable structure in the RF path which presents a high impedance at that frequency (e.g. a band-pass filter at the signal frequency, selective TR, a band-stop filter at the image frequency).

This solution to the problem is not without disadvantages, since, besides involving the complication of an added structure, it necessitates making adjustments on changing frequency.

In the field of balanced converters, those having a hybrid co-axial-waveguide structure are particularly convenient since this, as is well known in the current technique, is ideally suited to the use of diode converters which are realized in well built containers and are easily replaceable in case of failure.

SUMMARY OF THE INVENTION

The scope of this invention is the realization of an improved balanced converter of hybrid structure with waveguide R.F. input and having a particularly low level of noise, obtained by favorable termination conditions of both the image frequency and the idle frequencies, and in which the network determining the correct termination at image frequency and the idle frequencies is integrated into the configuration of the converter itself.

A balanced microwave receiver converter of a hybrid structure with R.F. input in a loaded waveguide is provided wherein the waveguide has a parallelopiped construction. The R.F. input is fed into a first side of the waveguide, which side is open. The second side, orthogonal to the first side, provides an intermediate frequency (I.F.) output. The third side, opposite to the second side, is provided with an input element which is adapted to be coupled to a local oscillator (L.O.). Inside the waveguide, a pair of diodes are secured in a spaced coaxial arrangement. A susceptance device is placed on the first side, in parallel with the R.F. line, to provide for R.F. frequency matching and the reflection with the right phase of the image oscillation produced by the diodes. The I.F. output is derived from a pair of lines which pass through an insulating support block supported between a pair of coupling elements seated inside the waveguide. The inner ends of the output lines are coupled by a pair of inductors to the coupling elements. The support block terminates in a reduced portion adapted to support a pair of coupling elements which, in turn, support the diodes. The input element comprises a cylindrical conductor having an inner end in proximity to the diode to define therebetween a capacitance C. The other end of the conductor is terminated by an insulated washer and a resistor washer of material having predetermined resistivity secured by a screw which serves as an outside terminal. The resistor washer defines a resistance R of a value equal to about Zo, which is the characteristic impedance of the cylindrical conductor.

An object of the invention is to provide an improved balanced converter of hybrid structure with waveguide R.F. input.

Another object of the invention is to provide appropriate terminations for the transmission of both image and idle frequencies in which the terminations are integrated with the configuration of the converter itself.

A further object of the invention is to provide a susceptance device in the R.F. input to obtain proper control of frequency development in the converter.

A still further object of the invention is to provide a susceptance device which can be readily adjusted to accept various types of diodes.

BRIEF DESCRIPTION OF THE DRAWINGS

The invention will now be described with reference to the figures listed below.

DESCRIPTION OF THE PREFERRED EMBODIMENT

Figure 4:
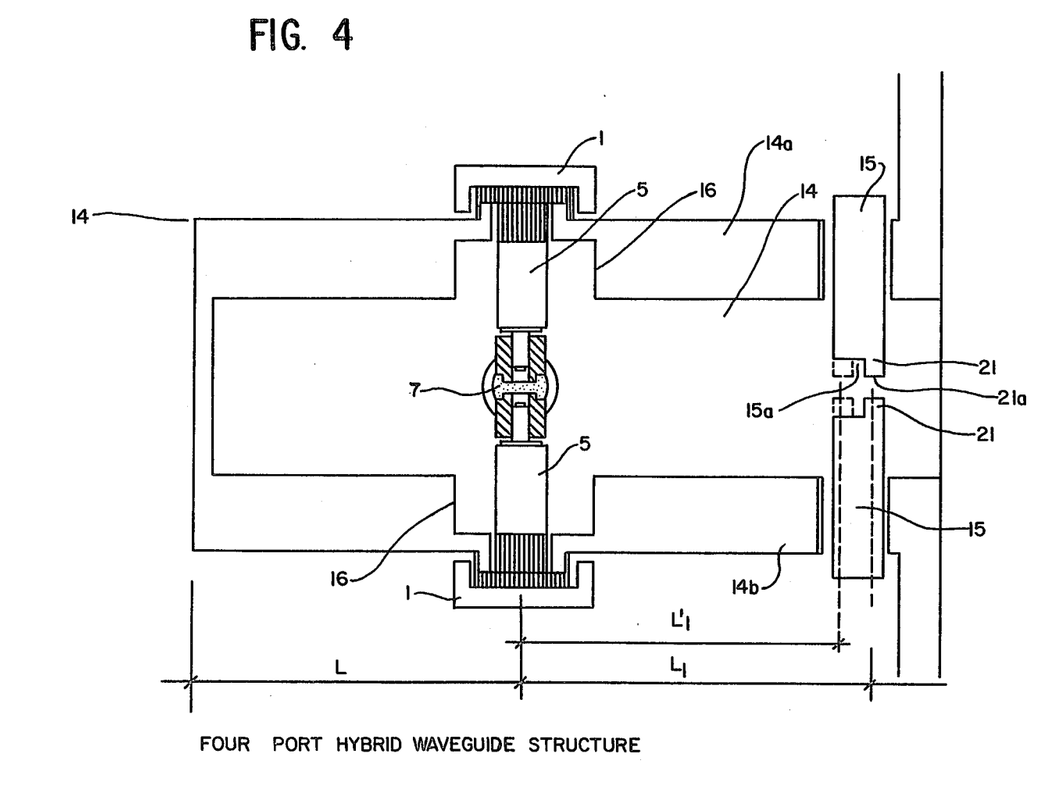
FIG. 4 shows a cross-section of the converter in accordance with the invention, in a plane parallel to a line L1 of the diagram in FIG. 3.
Figure 5:
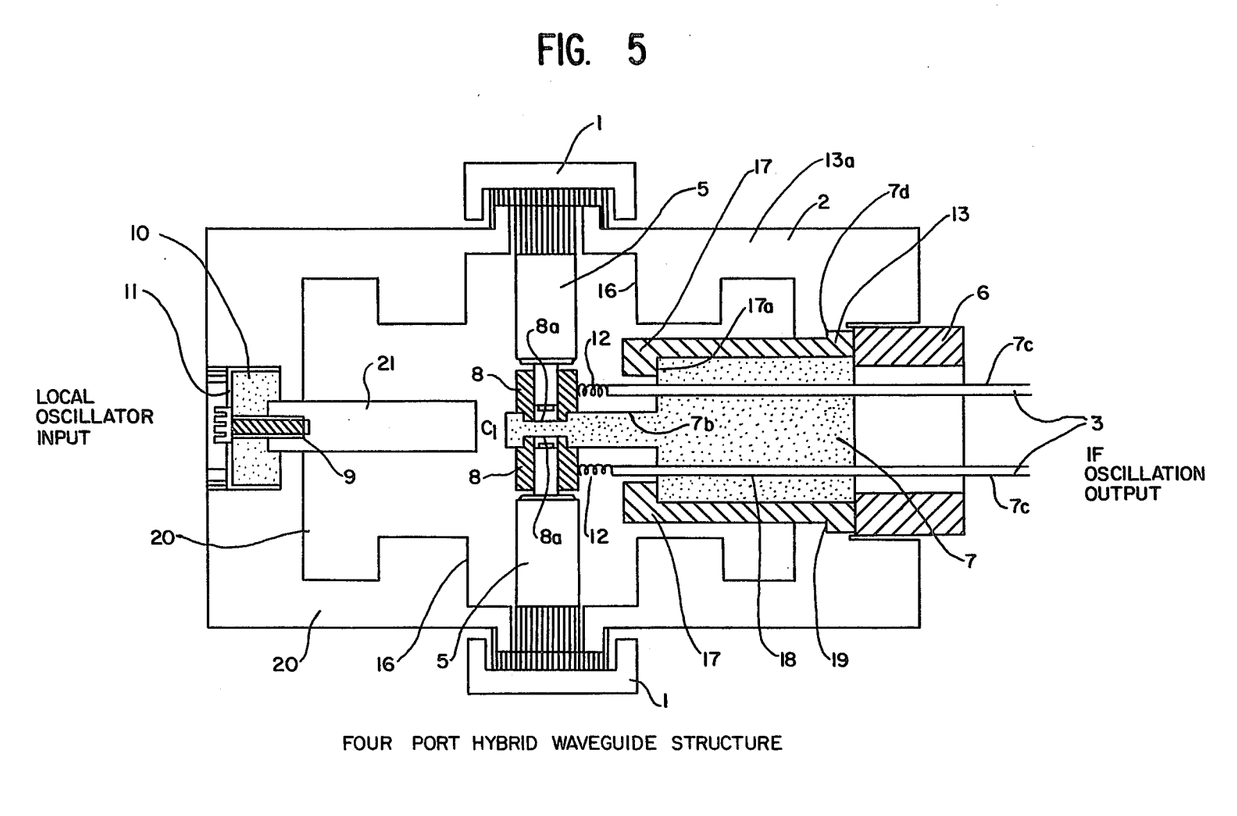
FIG. 5 shows a cross-section of the converter in accordance with the invention in a plane parallel to a line L2 of the diagram in FIG. 3.

The preferred embodiment will be particularly described in reference to FIGS. 4 and 5. However, before proceeding with the description of the preferred embodiment, a discussion will be presented in reference to the remaining Figures, which will be helpful in understanding the invention.

Figure 1:
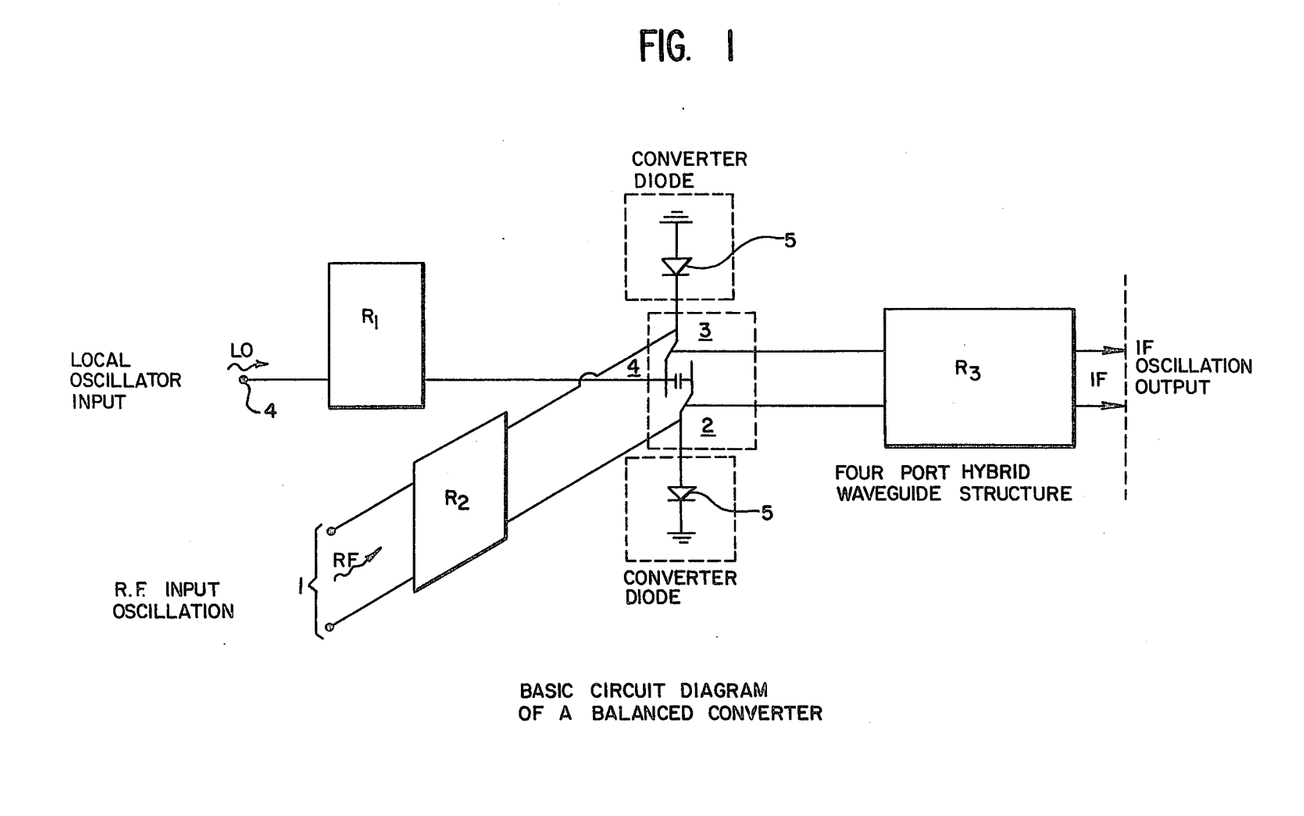
FIG. 1 shows a basic circuit diagram of a balanced converter.

Now, with reference to FIG. 1, we see a basic circuit diagram of a balanced converter. The blocks identified by the designators R1, R2 and R3 represent networks as indicated below:

R1: the network matching the load to the LO oscillator and reflective for the IF and RF oscillations.

R2: the network matching the load to the RF input oscillation and reflective to the IF oscillation.

R3: the network transparent to the IF oscillation and reflective to the LO and RF oscillations.

It should be emphasised that this diagram is not referred to a form of realization characteristic of this invention, but it is valid in a general way, being known to the experts in the field, and it has been introduced merely to better illustrate the principles of operation, and to point up the improvement introduced by the invention.

Further it should be underlined that this is an equivalent circuit diagram i.e. a diagram in which electronic symbology is used to indicate components (capacitors, lines, impedances, etc.) which are realised in the design of the invention with mechanical elements in a way which is well known to the technicians working in the microwave field and which will be described below. Thus the balanced converter is formed by:

(a) a four-port hybrid structure (drawn within the dotted box 3a) in which ports indicated by 2 and 3 have the converter diodes 5 connected as terminating loads and the ports indicated by 1 and 4 (with interchangeable functions) are fed by the RF and LO oscillations. Since the port 1 is drawn with two lines balanced to ground, ports 1 and 4 are electrically decoupled from each other, while the oscillations at ports 3 and 2 are in phase with each other if coming from port 4 and in antiphase if coming from port 1. This allows the hybrid structure to function as a balanced converter.

(b) non-linear elements (converter diodes), indicated by 5, which, connected as terminating loads to ports 3 and 2, function to convert the RF (radio frequency) oscillations to IF (intermediate frequency).

(c) the networks placed at the input of the gates 1, 4 and at the RF output function to provide only predetermined oscillation at the respective ports. If we could count on a perfectly balanced hybrid structure and on terminating loads at ports 3 and 2 with perfect matching, the networks placed at port 4 or at the IF output ports would not require any electrical characteristics at the R.F. frequency. Since, however, a portion of the power of the R.F. generator connected to port 1 is dissipated at port 4 and at the output port, worsens the noise figure in equal measure (dB for dB). It is better, when the objective of primary importance is to render the noise figure minimum, to make the networks placed at port 4 and the IF output also reflective at the RF frequency.

(d) The capacitors 3b placed within the hybrid structure in the lines connected to ports 3 and 2 have the function of separating from one another the circuits for the measurement of the D.C. supply current flowing in the diodes. They have an additional function, well known in this technique, of providing for separate measurements of the DC supply, and immediately identifying a failed diode.

In order to achieve the main aim of this invention, i.e. obtaining and maintaining low noise figures, it is necessary as to resolve the problem of controlling the functioning of the structure at the image frequency and idle frequencies.

The efficient control of the currents at the image frequency and idle frequencies is, as is seen, somewhat difficult since they have three different paths through which they can pass (port 1, port 2 and the IF path), and through which in fact they pass in an uncontrolled manner.

Further, as far as the image frequency (which is separated from the RF oscillation frequency by only double the IF frequency) is concerned, if the converter must operate within an RF band wider than double the IF frequency there is the additional difficulty that the matching networks to the load placed in the LO and RF paths, i.e. R1 and R2 will be operating in the same frequency band as the image oscillation.

In the current technique, this frequency is allowed to circulate uncontrolled or a solution to the problem is approached by means of a separate reflecting structure placed at the input of the matching network on port 1 (R2 formed, for example by a band pass filter at the signal frequency or by a band stop structure at the image frequency or by a selective TR in the case of a radar receiver).

Figure 2:
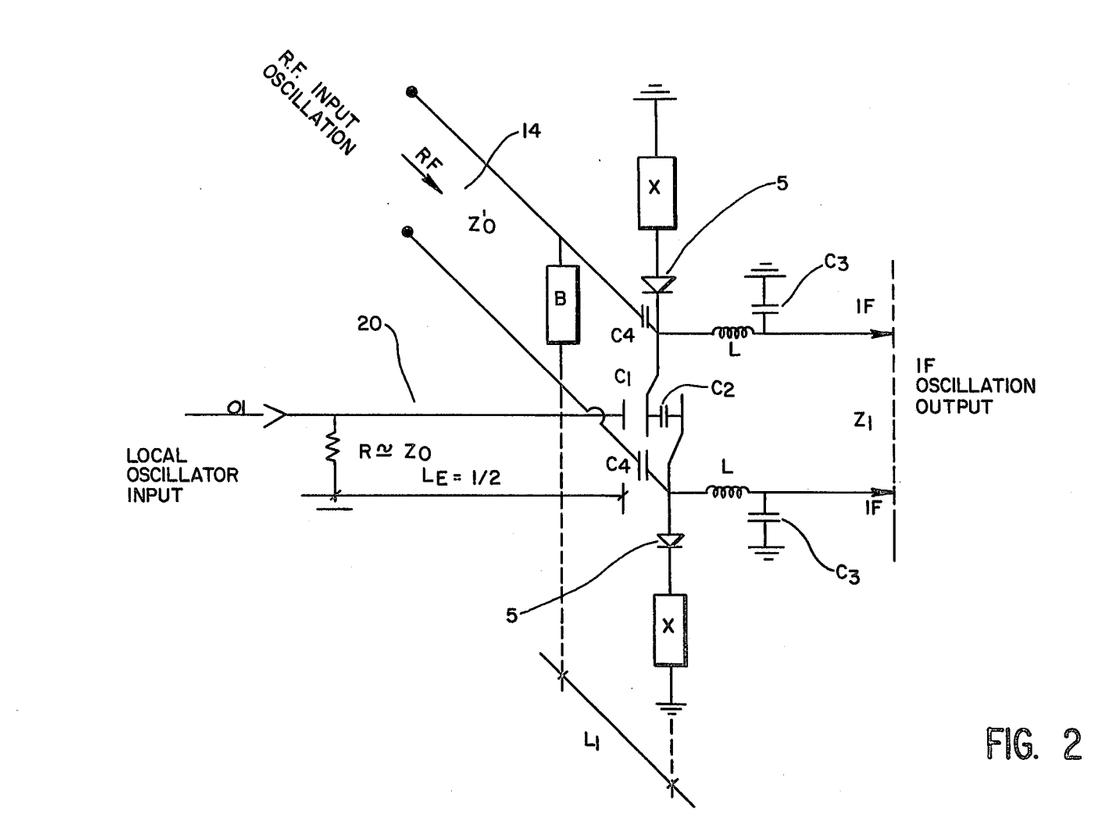
FIG. 2 shows an equivalent electrical circuit of the converter in accordance with the invention.

Consequently it is necessary to allow for "ad hoc" tuning operations for varying the particular working frequency within the operational band of the converter. This problem has been confronted and solved by means of the converter which is the subject of this invention and where recourse is made to a particular form of realization which uses a coaxial waveguide network as a hybrid structure. The geometrical and mechanical characteristics of this hybrid structure will be described and illustrated below and the equivalent electrical circuit of it is shown in FIG. 2.

Figure 3:
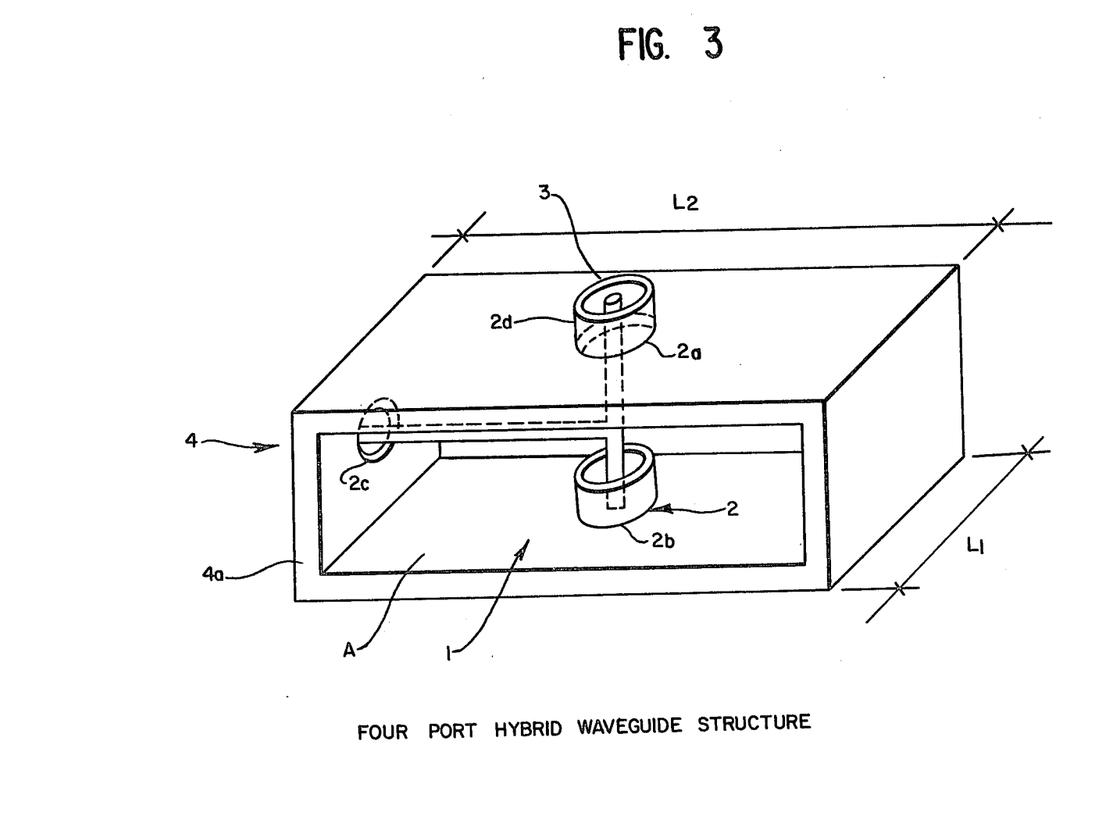
FIG. 3 shows diagramatically a type of hybrid coaxial-waveguide structure used for the realization of the converter and corresponding to the RF and LO and load ports indicated in FIG. 1.

The hybrid "co-axial-waveguide" structure which has been discussed above as being the essential element of the converter, is diagramatically constituted by a structure of the type indicated in FIG. 3 in the actual microwave technology. It is formed by a rectangular waveguide element practically consisting of a closed box in the form of a parallelopiped with one side open (A in the figure) which constitutes port 1 (RF input) in the equivalent circuit of FIG. 1. Two holes 2a and 2b used in the alignment of the lower and upper walls allow the passage of the coaxial cable 2d and form ports 2 and 3 of the equivalent circuit, the diodes forming the loads of these ports.

A third hole 2c made in a side wall 4a forms port 4 for the input of the local oscillation and is moreover coupled to the coaxial cable.

We repeat that what FIG. 3 shows of the hybrid structure is only a diagramatic representation made to better illustrate the principle of operation. In the following part of the description it will be shown in detail how this has been realized in the practice in this invention.

Referring to FIGS. 4 and 5 we can see the structure which is the subject of the invention as shown in the transverse and longitudinal sections shown in FIG. 3. The parts of the circuit resonant at I.F. (formed by L and C3 in FIG. 2) are not shown in FIG. 3. The operation and the circuit will now be described and at the same time reference will be made to the visualization of the device seen as both an equivalent electrical circuit and a representation of the mechanical structure.

The RF oscillation to be converted is applied to the balanced-to-earth line having a characteristic impedance Zo'. It is indicated with reference 14 both in FIG. 2 and in FIG. 4 where it appears in section as a piece of rectangular waveguide.

It should be noted at this point that in the diagramatic representation of FIG. 3, the hybrid coaxial-waveguide structure is formed by an element of parallelopiped form with flat walls which bound a space also of rectangular parallelopiped form on the inside.

Figure 9:
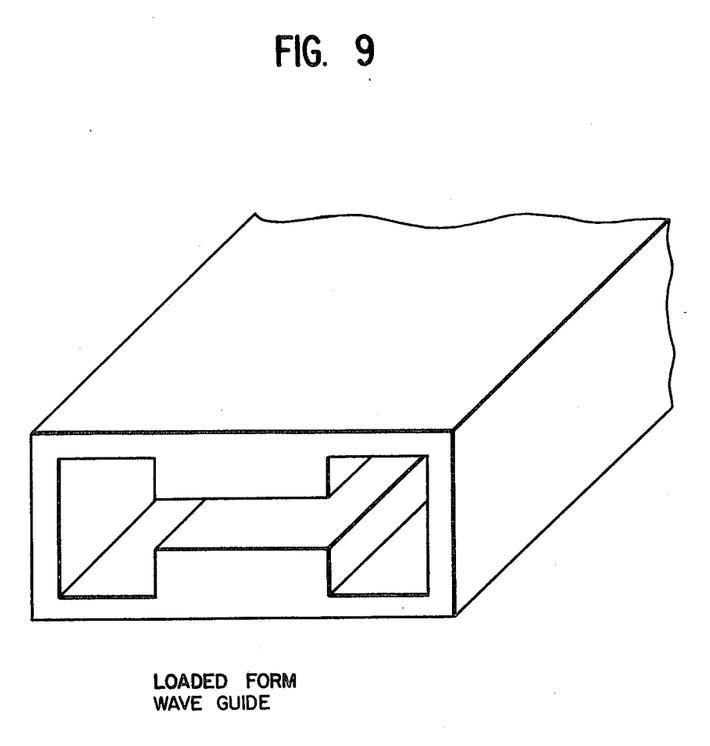
FIG. 9 shows a waveguide in loaded form.

In reality, this element forming the body of the waveguide presents two spaces in the central part of the upper and lower walls which give rise to the so-called loaded structure ("ridged") shown in FIG. 9.

The waveguide is realized in this form and made to a size such that the fundamental mode is transmitted upto the third harmonic of the LO, which would not be possible with a rectangular guide. This contrivance guarantees the repeatibility of the terminations for the "idle" frequencies of the LO 2nd and 3rd harmonics because it prevents the uncontrolled propagaionn of the respective oscillations with the variation of the diode characteristics, with the working and mounting tolerances and the variation of L.O. power. Besides that, it permits both the realisation of the circuit of FIG. 2 and the shortening of the electrical distance of the diodes from the rest of the circuit.

A susceptance B (ref. 15 of FIG. 4) is placed in parallel with this line. It has been realised with a mechanical component formed by two cylindrical bodies threaded, and screwed to the upper and lower walls of the waveguide. A more detailed description of this device will be given later.

This circuit, in which the positioning of the converter diodes at a distance of $l_{80}$ is important, provides both for the RF frequency matching and the reflection with the right phase of the image oscillation produced by the diodes in the conversion process.

The converter diodes are indicated by reference 5. They are of a conventional type, made by commercial companies and housed in cases within which the semiconductor elements are mounted. The latter are connected to the outside by means of two contacts of which one is directly fixed to the waveguide by means of a cylindrical connector and then connected to ground; the other is formed by cylinders whose electrical connection will now be described.

The active element (not shown) placed inside the case shown in the FIG. 4 is in reality connected to the electrode attached to ground by means of an internal conductor placed along the longitudinal axis of the container (in FIG. 4 shown dotted) and which together with the cylindrical housing 16 constitutes a portion of a line determining the reactance X of the circuit in FIG. 2. This reactance is thus connected in series with each of the diodes on the ground side. The function of this reactance is to control the idle oscillations of the third harmonic.

The other electrode of each converter diode 5 is inserted in and establishes electrical contact with a connecting element 8 formed by a hollow cylinder which has one end with its outside diameter reduced so that it may be inserted, as will be seen later, in a support of dielectric material 7.

The two inductors L which are connected directly to the two connecting elements 8 are shown as helical elements 12, their outer ends being directly connected to the two lines 3 electrically in parallel and having a characteristic impedance Z1 across which the IF oscillation is taken.

The value of L as will be seen later must satisfy the relationship $\omega L >> Z_1$. The capacitive coupling which is established between the said connecting elements 8 constitutes the capacitor, indicated as C2 in FIG. 2, which imposes mutual dependance between the voltages which appear on the elements 8. Its value must be such as to satisfy the relationship $1/\omega C_2 <<$ Zo and Zo'.

Immediately at the output of the inductances L, there are a pair of capacitors C3 which connect the ends of the said inductors L to ground.

These capacitors are realised by means of the capacitive coupling which occurs between the lines 3 and projections 17 with which coupling elements 13 disposed above and below the dielectric support material 7.

This support material 7 is formed by a first cylindrical body 7a which is co-axially common with a second body 7b also of cylindrical form but of greatly reduced diameter. The free end of the second body 7b defines two housings 8a formed to hold the reduced diameter ends of the connecting elements 8.

The support 7 is also provided with holes 7c for the lines 3 to pass through. As previously stated, the coupling elements 13 are placed above and below the support 7. They are of an elongated and curved form so as to adapt to the external surface of the cylindrical support 7 jutting out slightly at a point 17a where the said support reaches the zone of reduced diameter 7b. The projections 17 referred to above occur at the point of this protrusion. At the other ends of the coupling elements 7, there are flanges 13a which are inserted in a seat 7d formed in the body of the waveguide 20 and which serve to support the coupling elements.

In the circuit diagram of FIG. 2, the line of characteristic impedance Zo to which the LO oscillation is applied is marked 20. In FIG. 5 it will be seen how that line is realised by a portion of a waveguide 20 being intercepted by a cylindrical conductor 21 which is held in position by a screw 9 which has the function of establishing an electrical contact with the outside by passing through a washer made of insulating material 10.

This line is coupled to the hybrid structure via the capacitive coupling C which is formed between the free end of the cylindrical conductor 21 and the connecting elements 8. The resultant reactance should satisfy the relationship:

$$1/\omega C_1 \, Zo$$

A resistance of $\sim \approx 20$ is placed in parallel with this line, at a distance $l_2 \approx \Delta/2$, in the range of the operating frequency of the LO.

Figure 6:
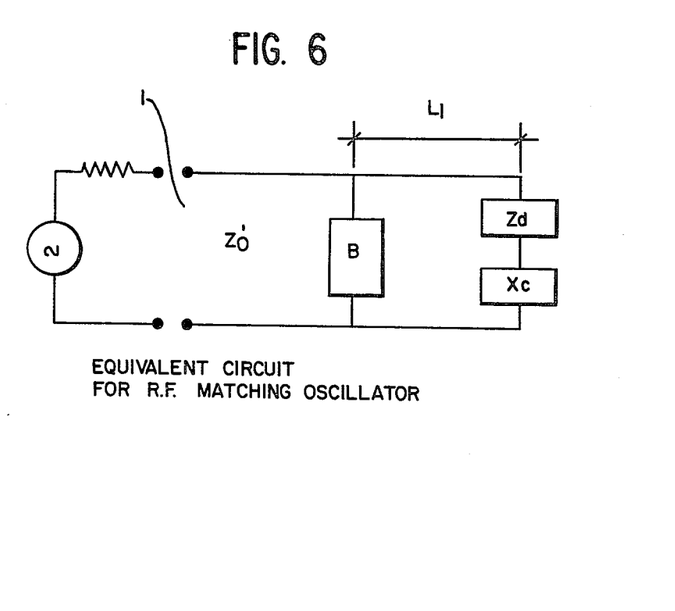
FIGS. 6 and 7 show, respectively, the equivalent circuits for the RF matching and image oscillator.

Whenever the relationships $$1/\omega C_1 >> Zo; \ 1/\omega C_2 << Zo \text{ and } Zo'1/\omega C_1 >> Z_{IF}$$

are satisfied, from what has been said above, it will be seen how the equivalent circuit of FIG. 2 meets the requirement, as shown in FIG. 1, of a typical network of a balanced converter. The above relationship additionally, as indicated in FIG. 6, controls the idle oscillations of the 2nd and 3rd harmonics and the image oscillation.

The generator of the RF oscillations applied to port 1 sees an equivalent circuit, as indicated in FIG. 6, in which for simplicity only one diode is shown. It is formed by a line of impedance $Zo'$ on which a susceptance B is placed at an electrical distance $l_i$ from the diodes.

The reactance X (see FIG. 2) placed in series with the diodes, is formed, as seen above, with a piece of line having a characteristic impedance $Zo''$ and $\lambda/4$ long to the third harmonic idle frequency $\omega_3 = 3_\omega$.

Therefore $X = \infty$ for $\omega_3 = 3_\omega$ independently of the value of $Zo''$. In fact, it is $X = Zo''\text{tg } l/\lambda 2\pi$ which gives $X = Zo''\text{tg}\pi/2 = \infty$ independently of $Zo''$ for $\omega_3 = 3_\omega$.

At the frequency $\omega$ is $X_c \approx Zo''\text{tg } \pi/6$ and therefore $X_c$ is a function of $Zo''$. By varying the values of B and $X_c$ it is possible to effect the matching in relation to different values of the length $l_{80}$ which in its turn must be chosen for the most favorable phase of $f_i$ in order to obtain the best termination for the image oscillation.

As stated above, the values of B and $l_{80}$ can be adjusted within certain limits by means of a regulating device which will now be described.

Referring to FIG. 4, it will be seen that in the upper and lower walls 14a and 14b of a portion of a waveguide 14 which forms the RF input, there are two cylindrical elements 15 screwed into the said walls. Some material has been removed from these cylindrical elements 15 at the inner ends 15a so as to form two teeth 21 protruding from the said inner ends.

The susceptance B is formed by means of the capacitive coupling which is established between the external flat surfaces 21a of the teeth 21.

Its value may be adjusted by suitably rotating the two threaded cylindrical elements 15 to vary the distance which separates the surfaces 21a and, therefore, the value of the said susceptance.

Once the flat surfaces 21a have been set at the desired distance, if the two cylindrical elements 15 are made to rotate simultaneously, this distance will remain unchanged, but the position of the two teeth will vary with respect to the diodes 5 and, therefore, the distances $\rho_i$ ($\rho_i$ dotted in FIG. 4).

Figure 7:
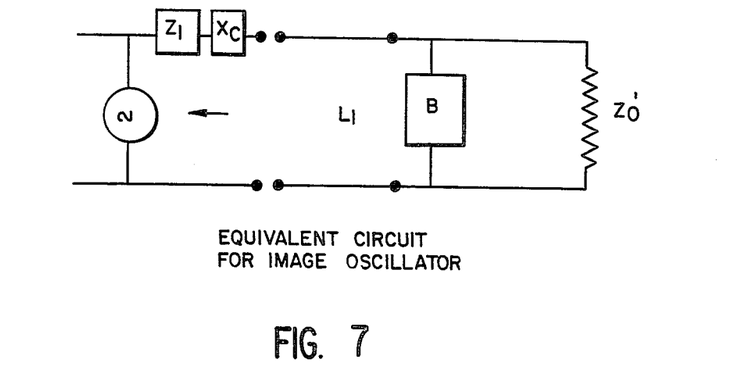

However, as stated, the simultaneous variation of the values of B and $\rho_i$ is possible, this makes it possible to use converter diodes of different families for the device i.e. to adapt it to the particular equivalent circuit of the semiconductor. Since at the image frequency the diodes become generators of this frequency with an internal impedance $Zi \neq Zd$ ($Zd$ being the impedance presented by the diodes as terminating impedance for the RF oscillation to be converted) the equivalent circuit for the image oscillator becomes that of FIG. 7. In this figure, the susceptance B and the reactance $X_C$ are shown unchanged, the image oscillation being near to the frequency of the working oscillation.

The circuit of FIG. 6 may be considered basically as a transformer which adapts the impedance of load $Zd$ to the internal impedance of the generator $Zo'$.

At the image frequency at which the diode becomes a generator with an internal impedance $Zi \neq Zd$, the matching conditions are no longer maintained and the power available at the image frequency is not all dissipated in the load (now represented by the internal impedance of the RF generator $Zo'$).

The search for the most suitable phase for the load impedance seen from the diodes at the image frequency in order to improve the noise figure is sought as the most favorable value of distance $\rho_i$.

As far as the problem of the idle frequency at the third harmonic is concerned, with reference to FIG. 2 it may be seen that, as $X = \infty$ for $\omega_3 = 3\omega$ the circulation of third harmonic currents is completely prevented.

Now we will examine the problem of idle frequencies at the second harmonic. Referring to FIG. 2, in which the diodes are seen as generators of second harmonic idle frequencies and the RF, OL and IF ports are terminated by their relative loads, it will be seen that if the path, formed by the inductance L and by the condenser $C_3$, has a zero reactance, the control of the circulation of the second harmonic is assured.

Figure 8:
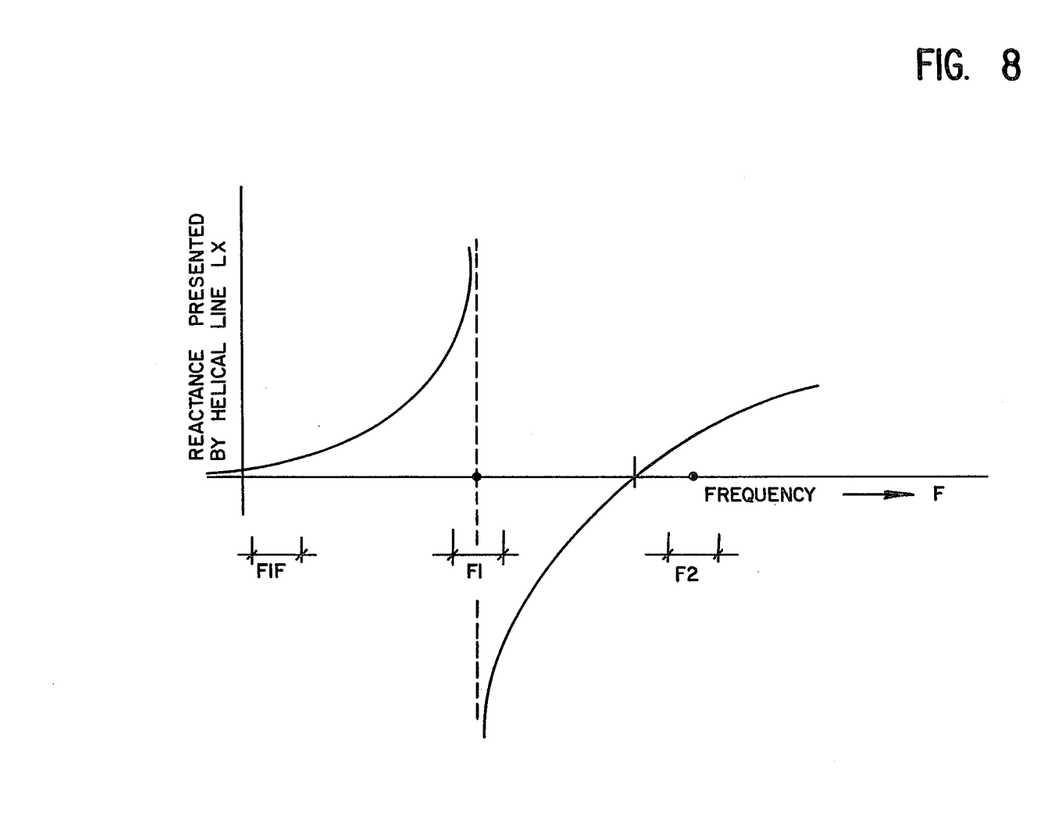
FIG. 8 shows a reactance X presented by the helical line L of FIG. 2 as a function of frequency.

If the inductance L is formed with a helical line, we may take advantage of the behavior of the reactance of this line as a function of the frequency to simultaneously bring about the conditions of:
  negligible reactance at the IF frequency
  high reactance at the RF and LO frequencies
  low reactance at the 2nd harmonic idle frequency In fact the behavior of the reactance as a function of the frequency in a helical line is indicated in FIG. 8 in which the desired conditions are seen to be realised.

The capacity $C_3$, indicatd in FIG. 2, which practically has no effect on the behavior of the reactance in the range of IF, RF and LO frequencies, serves to adjust the minimum reactance at frequency f2. Using the criteria explained above, a converter operating in the range of 3 GHz, and with an SWR < 1,8 in a band > 100 MHz, has been realized. The converter has been terminated in an IF amplifier with $F_{IF} \approx 2dB$ nom.

The values of the noise figure, measured without resorting to electrical adjustments or the varying of the particular working frequency within the band and with varied pairs of commercial diodes, are contained within a range of 5 to 5,5 dB using Schottky type diodes.

The values are entirely satisfactory in comparison with those of the state of the art. The invention has been described with particular reference to one of its embodiments, but it is understood that variations and modifications may be made to it without in this way going out of the ambit of protection of this industrial plant patent.

I claim:

1. A balanced microwave receiver converter of a hybrid structure with RF input in a ridged waveguide comprising:
- a pair of RF input lines coupled to a source of RF oscillation,
- a pair of diodes terminating said RF input lines with a characteristic impedance $Z_o'$,
- an adjustable susceptance B disposed across said RF input lines at a distance $l_1$, from said diodes,
- means for connecting first ends of said diodes to said RF input lines, and further means connecting the other ends of said diodes to ground via reactances X,
- means for capacitive coupling $C_2$ for coupling together the first ends of said diodes,
- a pair of output lines for an IF signal and having a characteristic impedance Z,
- means for connecting one ends of said IF output lines to said first ends of said diodes, said connecting means including a pair of helical inductive elements L, having junction ends connected to said IF output lines,
- means for capacitive coupling $C_3$ for coupling said junction ends to ground,
- means associated with a structure of said waveguide for coupling a source of LO oscillation to said IF output lines and to said first ends of the diodes, said coupling means including a capacitive coupling $C_1$ and a resistance R having a value of Zo being disposed in parallel with said capacitive coupling $C_1$ at a distance of $l_2$ from said diodes.

2. A receiver converter, as in claim 1, wherein said waveguide comprises
- a parallelopiped structure having an opening in a first side and defining an input for said RF oscillation,
- said structure having an interior portion disposed between said input and said diodes and defining said RF input lines, said susceptance B being disposed in said interior portion,
- said structure having a second side, orthogonal to said first side, defining an output opening for said IF output lines, said IF output lines including an insulating block extending through said output opening, a pair of spaced conductors passing through said insulating block and having internal ends connected through said inductive elements L to said diodes to thereby form junctions with said diodes, and a pair of spaced coupling members partially encompassing said insulating block, each coupling member having a projection extending to a respective junction, said capacitive coupling $C_2$ coupling said conductors to ground in the proximity of said junctions, said diodes being disposed co-axially with respect to each other in upper and lower sides of said waveguide, said diodes having said other ends coupled to ground, a projection on said insulating block extending between said first ends of said diodes and defining electrical insulation between said diodes,
- said structure having a third side, opposite to said second side, provided with an opening, a cylindrical element mounted in said opening and extending into the interior of said waveguide toward said diodes, whereby said cylindrical element in conjunction with a portion of said waveguide of length $l_2$ defines a line of characteristic impedance Zo for the LO oscillation.

3. A receiver converter, as in claim 2, wherein said susceptance B comprises a device having a pair of cylindrical elements provided with threads at one ends thereof and with projections asymmetrical with respect to the diameter at the other ends, whereby said elements may be threadedly moved with respect to each other so that said other ends are vertically and co-axially movable within said RF input line, the distance between the axis passing through said diodes and the axes through said elements being defined as $l_1$.

4. A receiver converter, as in claim 1 or 2, wherein each RF input line comprises a co-axial line coupled to the respective diode, a portion of a cylindrical wall of one co-axial line extending through an opening in said upper side of said structure and a portion of a cylindrical wall of the other co-axial line extending through an opening in said lower side of said structure, whereby each of said portions of said lines and said structure determine said reactance X.

5. A receiver converter, as in claim 1 or 2, including a pair of connecting elements, each element connected to a respective first end of each diode and providing support therefor, said connecting elements being pressure fitted in seats provided in the projection of said insulating block, whereby said capacitive coupling $C_2$ is determined between said pair of connecting elements.

6. A receiver converter, as in claim 1 or 2, including a washer made of electrically resistive material, a washer made of electrically insulating material, a recess centrally located in said third side of said waveguide structure and receiving both of said washers, a fixing screw, having a terminal head, passing through said resistive and insulating washers and threadedly engaging and supporting said cylindrical element, said resistive washer having a perimeter edge in contact with said waveguide structure, whereby said resistive washer establishes said resistance R which is connected in parallel with said LO oscillation line.

* * * * *